US008842847B2

(12) United States Patent
Geisler

(10) Patent No.: US 8,842,847 B2
(45) Date of Patent: Sep. 23, 2014

(54) SYSTEM FOR SIMULATING SOUND ENGINEERING EFFECTS

(75) Inventor: Jeremy Adam Geisler, Sandy, UT (US)

(73) Assignee: Harman International Industries, Incorporated, Stamford, CT (US)

( * ) Notice: Subject to any disclaimer, the term of this patent is extended or adjusted under 35 U.S.C. 154(b) by 1297 days.

(21) Appl. No.: 11/031,049

(22) Filed: Jan. 6, 2005

(65) Prior Publication Data

US 2006/0147050 A1 Jul. 6, 2006

(51) Int. Cl.
*H03G 3/00* (2006.01)
*G10H 1/00* (2006.01)
*G10H 1/06* (2006.01)

(52) U.S. Cl.
CPC ............... *G10H 1/0091* (2013.01); *G10H 1/06* (2013.01)
USPC ................................ 381/61; 381/118; 84/662

(58) Field of Classification Search
CPC ......... G10H 1/06; G10H 1/16; G10H 1/0041; G10H 1/0091; G10H 1/02; G10H 1/125; G10H 3/16; G10H 3/146; G10H 3/186; G10H 3/187; G10H 2210/265; G10H 2210/281; G10H 2250/115; H03F 1/327; H03F 1/3276; H04R 3/04
USPC ............................... 381/61, 118, 119; 84/662
See application file for complete search history.

(56) References Cited

U.S. PATENT DOCUMENTS 4,995,084 A 2/1991 Pritchard
5,032,796 A 7/1991 Tiers et al.
5,237,619 A * 8/1993 Frassinetti .................... 381/119
5,663,517 A * 9/1997 Oppenheim .................... 84/649
5,763,803 A * 6/1998 Hoshiai et al. .................. 84/626
5,789,689 A 8/1998 Doidic et al.
5,955,693 A * 9/1999 Kageyama ...................... 84/610
5,987,145 A * 11/1999 Lawton ......................... 381/103
6,664,460 B1 * 12/2003 Pennock et al. ................ 84/662
7,026,539 B2 * 4/2006 Pennock et al. ................ 84/662
7,279,631 B2 * 10/2007 Celi et al. ........................ 84/735

* cited by examiner

*Primary Examiner* — Xu Mei
(74) *Attorney, Agent, or Firm* — Brooks Kushman P.C.

(57) ABSTRACT

The invention provides an audio signal processing system for simulating sound engineering effects. The audio signal processing system may simulate, emulate or model sound engineering effects that may be present in a sample audio signal contained in a sound recording. The audio signal processing system may include an input signal, a first filter system, a nonlinear effect simulator and a second filter system. The input signal may include an audio signal and the sample audio signal. The audio signal may be a signal generated with a musical instrument and the sample audio signal may be a previously processed signal for a sound recording. The first filter system may include a chain of filters configured to condition the audio signal. The nonlinear effect simulator may receive the audio signal processed by the first filter system and modify the audio signal nonlinearly. The second filter system may be configured to receive the modified audio signal from the nonlinear effect simulator and process the modified audio signal according to a frequency response that corresponds to the sound engineering effects. The sound engineering effects are determinable based on the sample audio signal and the modified audio signal.

57 Claims, 12 Drawing Sheets

SYSTEM FOR SIMULATING SOUND ENGINEERING EFFECTS

BACKGROUND OF THE INVENTION

1. Technical Field

The invention relates to a system for simulating sound engineering effects. More particularly, the invention relates to an audio signal processing system that simulates sound engineering effects that were produced when a sound was previously created and processed for recordation.

2. Related Art

Digital signal processing techniques may replace analog signal processing techniques or provide additional processing of an analog signal. Digital audio signals have started to replace what have traditionally been analog audio signals, such as recordation of digital audio signals on compact discs instead of analog audio signals recorded on LP records. Reproduction, modification, creation, recreation, etc. may be easier, simpler and more accurate with digital audio signals rather than with analog audio signals, even with the quantization noise that may be present in digital signal processing. Accordingly, digital signal processing techniques heavily affect the music industry and among other things, musical instruments such as an electric guitar.

An electric guitar is typically coupled to an amplifier and one or more loudspeakers. The amplifier and the loudspeakers may be either separate devices or combined in a single unit. The amplifier may be a tube amplifier that uses traditional vacuum tubes to process audio signals in the analog domain. These tube amplifiers are still widely used because many musicians are of the opinion that a tube amplifier provides a musically superior, "warm" sound. Despite having desirable sound qualities, the tube amplifier has disadvantages and limitations that result from operation in the analog domain. To overcome these limitations, digital signal processing techniques have been used to simulate a tube amplifier.

Simulation of a tube amplifier typically focuses on simulation of the tonal characteristics of the tube amplifier. The tonal characteristics of the tube amplifier may result from distortion of an audio signal during processing. Distortions may occur when the tube amplifier is overloaded, overdriven and/or somewhat intentionally misused, for example, by connecting an output of one tube amplifier to an input of another tube amplifier. These types of distortion may be the reason why the tube amplifier produces a musically appealing sound. For example, tube amplifiers manufactured by Fender Musical Instruments Corp. are well known and may be recognizable by their signature distortions. Simulation or modeling of a Fender tube amplifier using digital signal processing techniques may produce this signature distorted sound. Various types of amplifier simulators may be made and used to produce the desirable distortion. In addition, warping between multiple different amplifier simulators may be implemented.

Despite developments of simulation or modeling techniques that simulate the desired tonal characteristics of the tube amplifier, no simulation and modeling techniques may attempt to simulate sound engineering effects that one hears on a medium such as a sound recording. In addition, the simulation or modeling techniques focus on an electric musical instrument such as an electric guitar and do not extend to an acoustic musical instrument such as an acoustic guitar or vocal sound. Accordingly, there is a need for a system for simulating sound engineering effects that is applicable to both electric and acoustic musical instruments.

SUMMARY

The invention provides an audio signal processing system that simulates, emulates or models sound engineering effects. A musical instrument such as a guitar may supply an audio signal to the audio signal processing system. The audio signal may be processed to have the sound engineering effects by the audio signal processing system. The sound engineering effects may be determined based on the audio signal and a sample audio signal. The sample audio signal may be previously created and a recorded version. The sample audio signal is a reference audio signal and contains the sound engineering effects. The audio signal processing system may include a plurality of filters. Filters may condition the audio signal to have the preamplifier effects, nonlinear effects creating distortions and/or sound engineering effects. In particular, the sound engineering effects may be implemented by a single, linear filter. The length and coefficient of the single linear filter may be designed and determined to represent the frequency response corresponding to the sound engineering effects. Accordingly, the audio signal processing system may enable musicians to consistently simulate desired tonal characteristics of a previously created audio signal that was produced to include sound engineering effects. For example, the audio signal processing system may enable simulation of the signature sound engineering effect of a particular artist's musical works, or enable musicians to provide a distinctive studio version of an audio sound during a subsequent live performance.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

The invention provides a system for simulating sound engineering effects. In particular, the invention provides an audio signal processing system that simulates, emulates or models sound engineering effects. The system may receive an input audio signal representative of a sound. The sound may be produced by a human or any other sound producing mechanism that is capable of being acoustically altered using sound engineering techniques. A guitar is one example of a musical instrument that is a sound producing mechanism. A guitar may be an electric guitar or an acoustic guitar. For convenience of the present discussion, an electric guitar and an acoustic guitar will be used as a source of sound to the audio signal processing system. The invention, however, is not limited to a guitar as a sound source and the use of various musical instruments, vocal sound and/or any other sound producing mechanism are possible.

Figure 1:
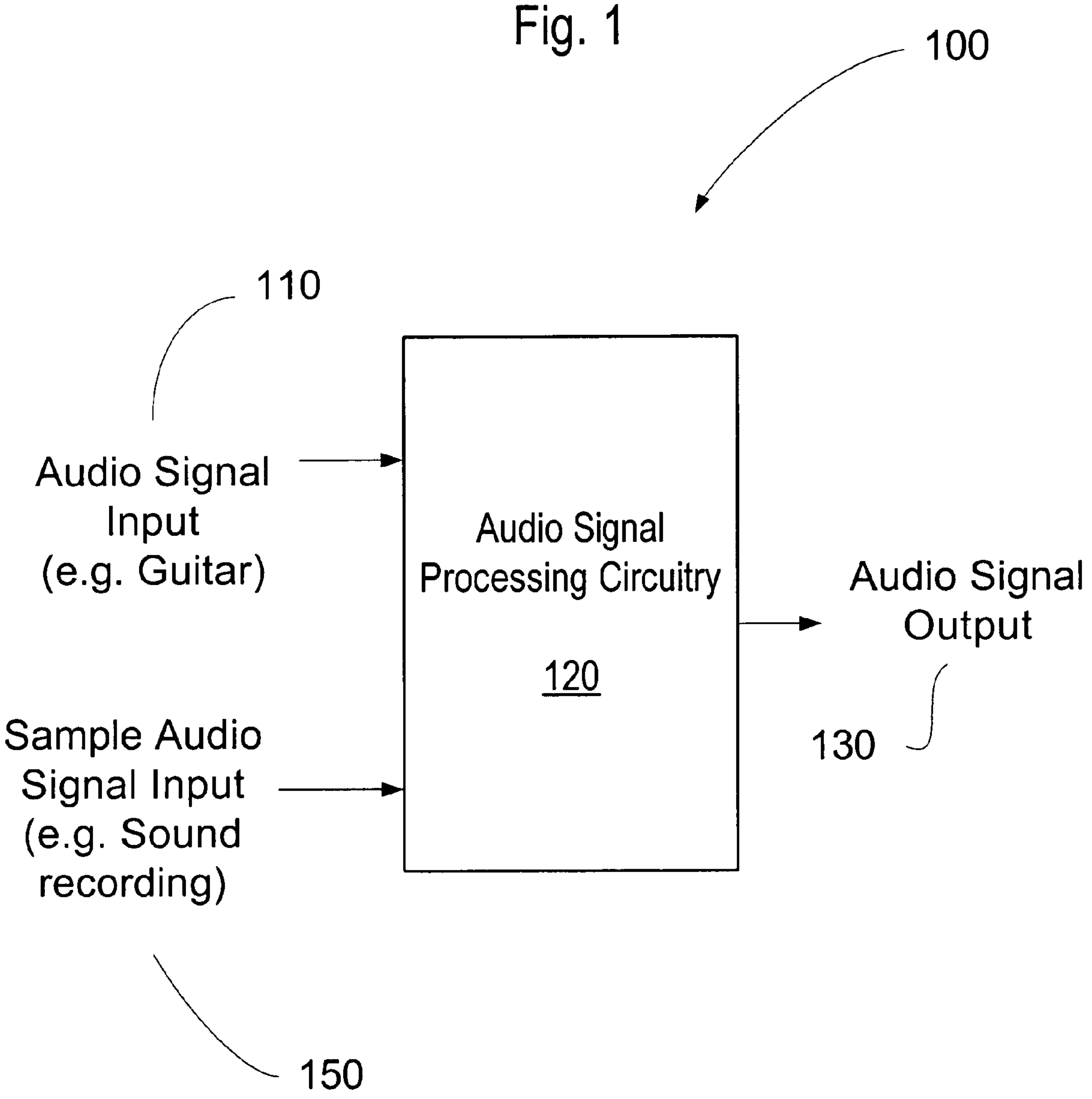
FIG. 1 shows a block diagram of an audio signal processing system.

FIG. 1 is a block diagram of an example audio signal processing system 100 that may be used to introduce simulated sound engineering effects into an audio signal. From a sound producing device, such as a guitar, an audio signal 110 may be input to an audio signal processing circuitry 120. The audio signal 110 may be in an analog format. The guitar may be an electric guitar or an acoustic guitar. An acoustic guitar is different from an electric guitar because the acoustic guitar may produce a desirable audible sound without electrical means to process and amplify the sound. An electric guitar, on the other hand, usually includes an amplifier to amplify and modify sound that is produced. A sample audio signal 150 may be another input to the audio signal processing circuitry 120. The sample audio signal 150 is a signal that one may hear on a sound recording, such as a compact disc. The sample audio signal 150 is a reference audio signal that may include sound engineering effects. Regardless of the type of guitar, the audio signal processing circuitry 120 may receive and process the audio signal 110 to simulate or emulate the sound engineering effects present in the sample audio signal 150.

As used herein, the term "sound engineering effects" is defined as the equipment configuration, settings and/or mixing that is used to process an audio signal to produce a storable audible sound with desired acoustical properties. The sound engineering effects may be achieved by altering acoustic properties of audible sound. Accordingly, the audio signal processing circuitry 120 may simulate the sound engineering effects that were used to process a previously produced recorded audible sound. Some examples of sound engineering effects will be described in detail in conjunction with FIGS. 2 and 3. In addition, as used herein, the term "audio signal" is defined as a signal derived from an audible sound to which simulated sound engineering effects are applied and the term "sample audio signal" refers to a previously captured reference audio signal that contains sound engineering effects that are to be simulated.

The audio signal processing circuitry 120 provides an output audio signal 130. The output audio signal 130 has been processed by the audio signal processing circuitry 120 to include simulated sound engineering effects. The audio signal 130 may sound like the sample audio signal 150, such as a guitar sound previously recorded on a sound recording, for example, the guitar sound from a sound recording of Eric Clapton or Jimi Hendrix. The audio signal processing circuitry 120 may determine the sound engineering effects present in the sample audio signal 150 based on the audio signal 110 and the sample audio signal 150, apply it to the audio signal 110, and output the sound engineering effects to the audio signal 130. A musical instrument that generates the sample audio signal 150 may be substantially similar or different from a musical instrument that generates the audio signal 110. For example, the audio signal processing circuitry 120 may determine the sound engineering effects that are applied to an audio signal from an electric guitar. A musician may apply the determined sound engineering effects to an audio signal generated from an electric keyboard or an audio signal generated from another electric guitar.

Figure 2:
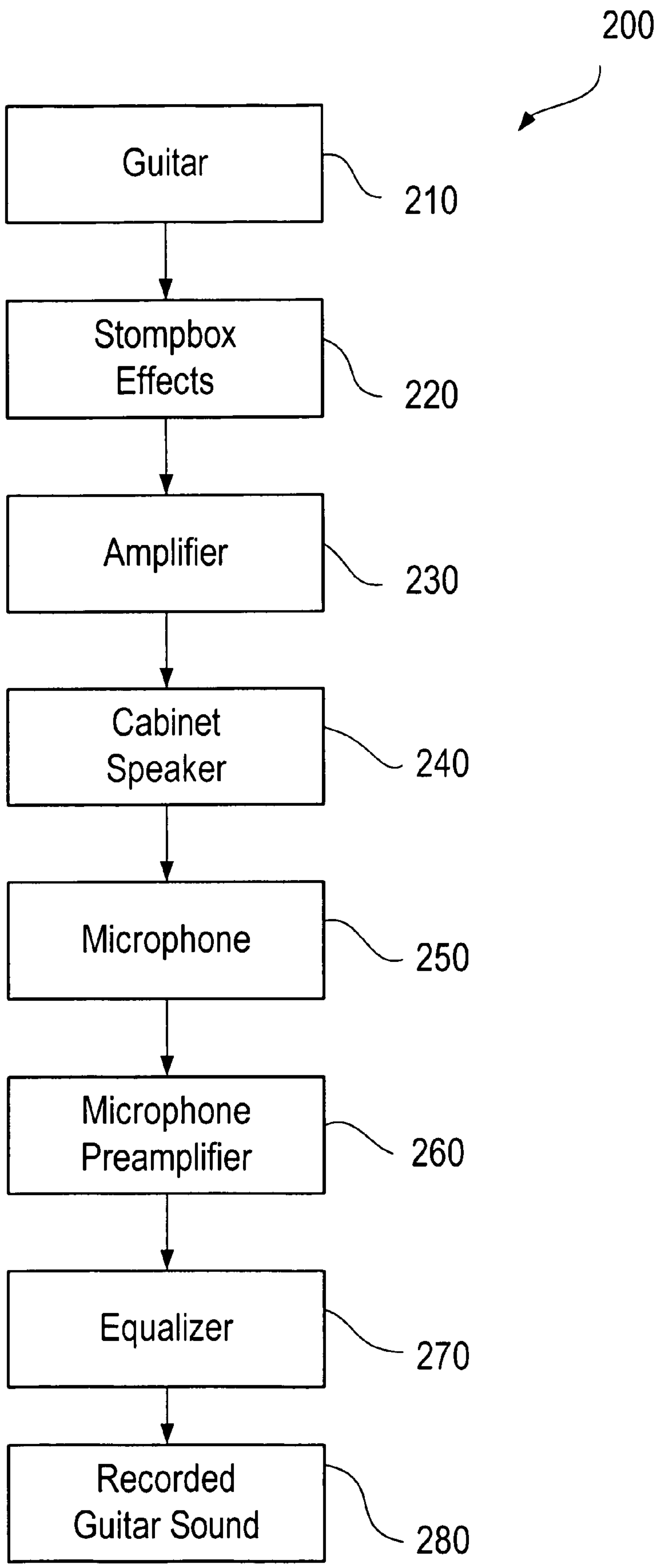
FIG. 2 is a flowchart illustrating one example of application of sound engineering effects during production of a sound recording.

FIG. 2 is a flowchart illustrating one example of producing a sound recording of a guitar sound. Production of a sound recording may include application of sound engineering effects, such as creating sound engineering effects in a recording studio. The sound engineering effects may be designed to produce a desired acoustical effect in an audio signal that is being used in a sound recording of music. The desired acoustical effect may be achieved by altering properties of an audio signal. This example involves an electric guitar that is coupled to an electric amplifier. A first step of producing a sound recording is to create an input audio signal from a guitar (block 210). The sound recording may be produced with only the guitar. Alternatively, the guitar may be one of a number of instruments or voices that will ultimately form the sound recording.

The input audio signal from the guitar may be subject to preamplifier effects provided by various sound effect devices such as a stompbox at block 220. Alternatively, or additionally, a fuzzbox or a pedal may be used to subject the audio signal to preamplifier effects. These devices may be used to provide additional sound effects in the audio signal. The preamplifier effects may be designed to make the audio signal suitable and ready for an amplifier. The audio signal processed to have various preamplifier effects may be input to an amplifier at block 230. The amplifier may be any type of amplifier such as a tube amplifier made by Fender Musical Instruments Corp. or an amplifier made by Marshall Amplification PLC.

The amplified audio signal may be output to a loudspeaker, such as a cabinet speaker at block 240. A producer or a sound engineer may choose or prefer a certain type of loudspeaker depending on the type of sound being recorded and/or the desired acoustical effect. Accordingly, selection of the cabinet speaker at the block 240 may be considered as one of sound engineering effects. In practice, however, the cabinet speaker at the block 240 may be dependent upon selection of the amplifier 230. As a result, blocks 250 to 270 may mainly represent sound engineering effects. The audio signal processed at the blocks 220 to 240 may be an input signal to sound engineering effects blocks 250 to 270. A producer and/or a sound engineer may exercise their discretion and expertise to achieve desired acoustical effects at the blocks 250 to 270. A producer and/or a sound engineer may participate in selecting a guitar, an amplifier or a cabinet speaker at the blocks 210 through 240. However, such participation may be limited because musicians tend to have strong preference and opinion on the selection of a guitar. Frequently, an amplifier and a cabinet speaker may be dependent on the selection of a guitar. Further, as noted above, an amplifier and a cabinet speaker may be selected as a package. To the contrary, the sound engineering blocks 250 to 270 may be entirely subject to discretion of a producer and a sound engineer.

At the block 250, the audio signal output from the cabinet speaker at block 240 as sound waves may be detected by a microphone. A producer and/or a sound engineer also may select a type of a microphone, the number of microphones, the location of the microphone(s) in a studio, etc. based on achieving a desired acoustical effect. The audio signal may pass through selected microphone preamplifier(s) and equalizer(s) at the blocks 260 and 270. The microphone preamplifier(s) and/or equalizer(s) may also be chosen and configured at the discretion of a producer and/or a sound engineer to obtain a desired acoustical effect. A final recorded guitar sound that includes the acoustical effects is produced at the block 280. Alternatively, or additionally, other sound engineering effects such as compression and reverb may be added in addition to the sound engineering effects shown in the flowchart 200. The final recording of the sound from the electric guitar may be used as a reference audio signal as described later.

Figure 3:
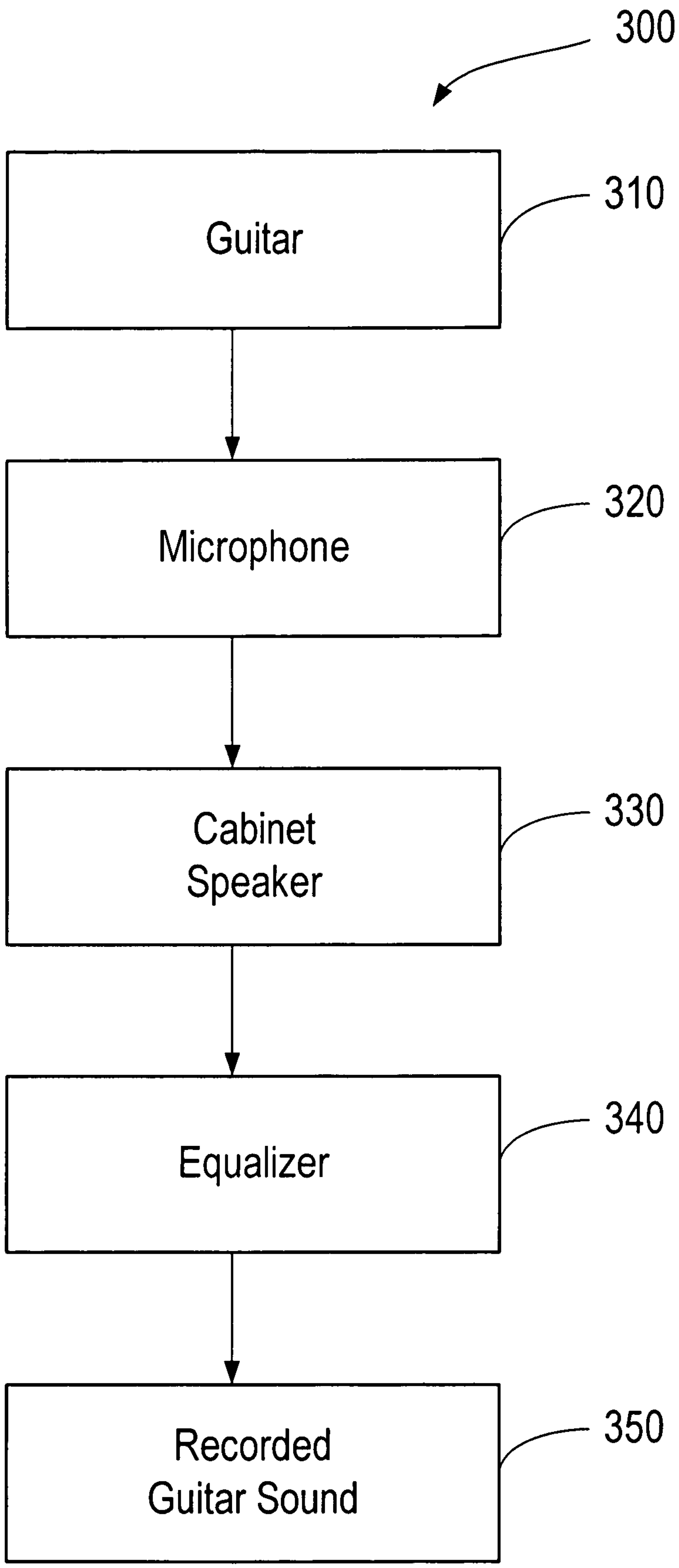
FIG. 3 is a flowchart illustrating another example of application of sound engineering effects during production of a sound recording.

FIG. 3 is a flowchart illustrating another example of producing a sound recording. Like the example shown in FIG. 2, this production of the sound recording also includes sound engineering effects that are implemented to create a sound recording. Contrary to the example described in FIG. 2, this example involves an acoustic guitar that may produce a desirable audible sound wave without an electric amplifier. Because an amplifier may not be used, entire blocks 320 to 350 may represent sound engineering effects blocks for an acoustic guitar. A sound wave produced by an acoustic guitar may be sensed by a microphone at blocks 310 and 320. The number and location of the microphone(s) may again be at the discretion of the producer or a sound engineer to obtain a desired acoustical effect. In addition, depending on the desired acoustical effect, the audio signal generated by the microphone(s) may be subject to sound engineering effects such as a cabinet speaker and equalizers at blocks 330 and 340. At block 350, a desired recorded guitar sound is produced. The desired recording of the sound from the acoustic guitar may be used as a reference audio signal as described later.

The sound engineering effects illustrated in FIGS. 2 and 3 are only specific examples that indicate what the sound engineering effects are and how they are applied in a recording studio. As should be apparent, almost unlimited variations are possible as to what type of sound engineering effects may be created, how the effects may be combined, in what sequence the effects may be used, etc. This decision is based on the expertise, techniques, necessity and/or experience of a producer and/or a sound engineer. A producer and a sound engineer may determine the desired acoustical properties of music or a sound to be recorded, for instance, a guitar sound. After considering the guitar sound produced by the guitar, the sound engineer and/or producer may determine sound engineering effects suitable for that guitar sound to obtain the desired acoustical properties. A producer may convey how sound engineering effects should be configured to achieve a specific guitar sound. Then, a sound engineer may select a certain microphone(s), an equalizer(s), a preamplifier(s), etc.

In FIG. 2, examples of the sound engineering effects that a producer and a sound engineer may exercise at their discretion are depicted in blocks 240 to 270 as noted above. In FIG. 3, the audio signal from an acoustic guitar may be subject to only the sound engineering effects that are implemented by the producer and/or sound engineer since sound waves may be produced directly from the guitar. Regardless of the guitar and/or amplifier, the sound engineering effects may vary greatly, for example, when a sound is produced and then reproduced later under different conditions, what type of music is produced for a sound recording, who are a producer and/or a sound engineer, artist-by-artist, a target audience, and so on. Accordingly, it is difficult to create universal rules to define elements of the sound engineering effects.

Referring back to FIG. 1, the audio signal processing circuitry 120 may simulate, for example, the sound engineering effects illustrated in blocks 250-270 and blocks 320-340 of FIGS. 2 and 3. As mentioned previously, accurate and repeatable sound engineering effects are difficult to achieve. In most instances, the sound engineering effects are based on case-by-case determination made by a producer and/or a sound engineer according to a song, a genre, an artist, a musical instrument, a musical performance, etc. For example, a producer and a sound engineer apply different sound engineering effects to rock & roll music and soul music, Michael Jackson's song and Sting's song, an electric guitar and an acoustic guitar. Accordingly, there is significant difficulty with simulating sound engineering effects by starting from an original audio signal as is applied in a recording studio like the examples of FIGS. 2 and 3, because prediction of the cumulative acoustical effects on the original audio signal is difficult and may not be realistic. As a result, to simulate the sound engineering effects present in an existing audio signal, such as a recorded audio sample, the audio signal processing system 100 may start with an analysis of the sample audio signal 150. The sample audio signal 150 may be stored on a medium such as a sound recording that already contains certain sound engineering effects that were designed and implemented by a producer and/or a sound engineer when the recording of the sample audio signal was made. Based on the recorded sound such as the sample audio signal 150 and an original sound supplied from a sound mechanism such the audio signal 110, simulated sound engineering effects may be determined and applied to any original sound whenever musicians desire to add the same, determined sound engineering effects thereto.

Figure 4:
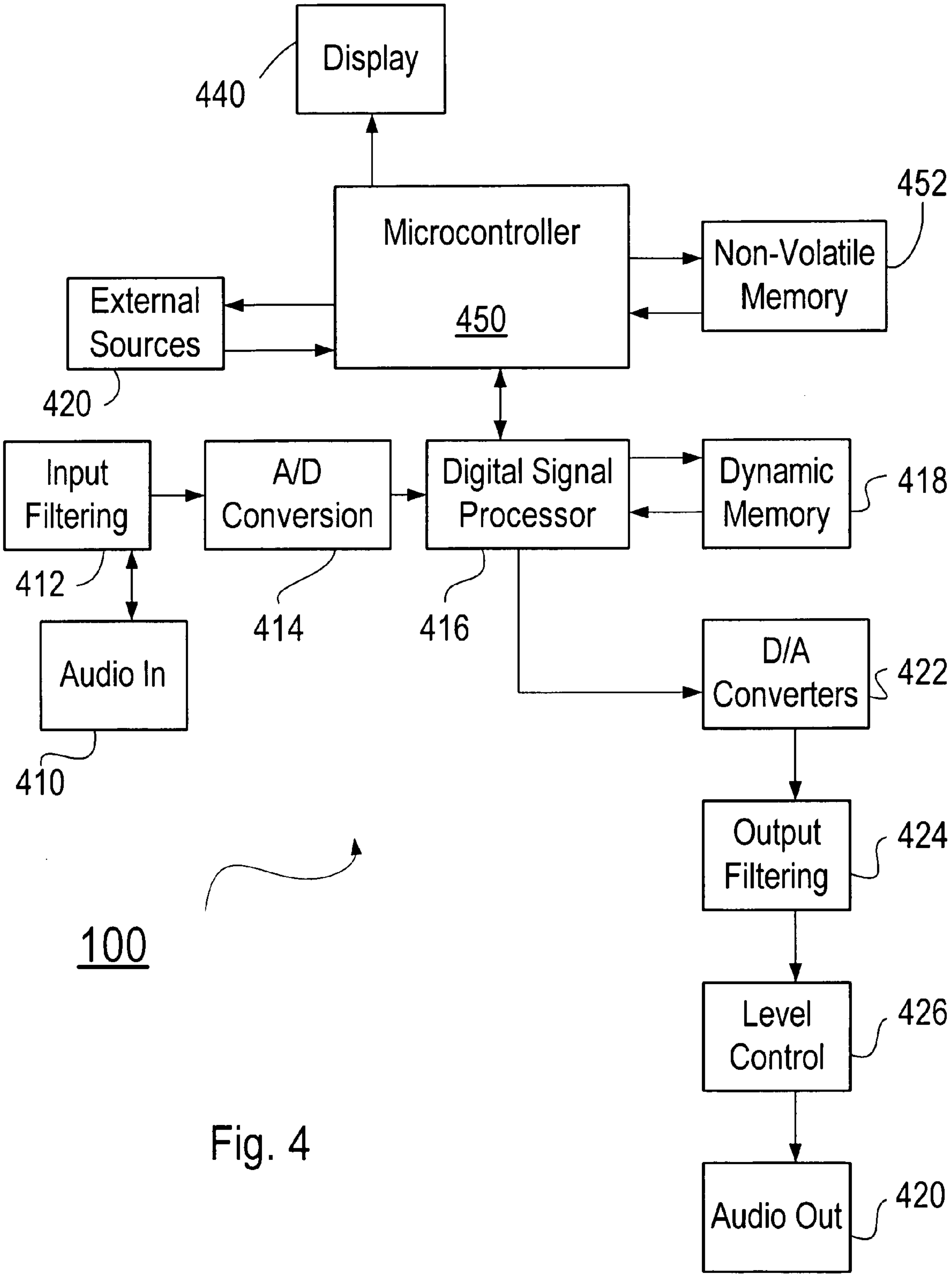
FIG. 4 is a block diagram illustrating a detailed structure of an example audio signal processing system.

FIG. 4 is a block diagram illustrating an example of a detailed structure of the audio signal processing system 100. An audio signal is input to an audio input 410, processed and output from an audio output 420. The audio signal may include an original audio signal from sound producing mechanism such as a guitar and a recorded version of an audio signal such as the sample audio signal 150 as shown in FIG. 1. The input audio signal may be subject to filtering with an input filter 412. Filtering with the input filter 412 may include any type of filtering, such as anti-aliasing filter. The anti-aliasing filtering may be applied to the audio signal prior to analog-to-digital conversion to prevent an aliasing effect. The anti-aliasing filter may include a low-pass filter that eliminates high frequency components that are greater than half of the sample frequency. In other words, high frequency components above Fs/2, where Fs is a sampling frequency, may be eliminated by the anti-aliasing filter.

The filtered input audio signal may be converted to a digital format with an analog-to-digital (A/D) converter 414. The digital audio signal may be processed by a digital signal processor 416 as described later. The digital signal processor 416 may be connected to a dynamic memory 418. The dynamic memory 418 may be any form of volatile and/or non-volatile data storage device that allows data storage and retrieval. Instructions executable by the digital signal processor 416, parameters and operational data may be stored in the dynamic memory 418. The processed signal may be converted to an analog format with a digital-to-analog (D/A) converter 422. The analog audio signal may be filtered with an output filter 424. The output filter 424 may include any form of filtering. A signal magnitude of the analog audio signal may be adjusted by a level control 426 prior to reaching the audio output 420. In other examples, additional or fewer blocks may be depicted to illustrate similar functionality.

The digital signal processor 416 may mainly engage in execution of a computer readable code that represents simulation effects. Execution of a computer readable code may involve computation and calculation that condition the audio signal according to the simulation effects. The simulation effects may include nonlinear effects, preamplifier effects, application of a simulation filter and any other signal processing necessary to simulate desirable effects as will be described in detail in conjunction with FIGS. 5 and 6. The digital signal processor 416 may communicate with a microcontroller 450 to process the audio signal. The microcontroller 450 may direct the digital signal processor 416 to execute computer readable code to process the audio signals. Unlike the digital signal processor 416 that may be directed to processing of the audio signal, the microcontroller 450 may control and supervise every unit included in the audio signal processing system 100 including the digital signal processor 416.

Alternatively, or additionally, the microcontroller 450 may engage in execution of a computer readable code that represents simulation effects. Among the simulation effects, the microcontroller 450 may execute computer readable code that implements application of a simulation filter. The microcontroller 450 may reside in any type of data processing system such as a computer.

The microcontroller 450 may selectively provide the digital signal processor 416 with computer readable code and/or parameters during processing of the audio signal. The computer readable code and/or parameters may be accessed from a memory 418 and external sources 420 by the microcontroller 450. The audio signal processing system 100 may be capable of simulating amplifier effects of various amplifiers. For example, computer readable codes to simulate a Fender tube amplifier and a Marshall's amplifier may be obtained by the microcontroller 450 and provided to the digital signal processor 416. These computer readable codes may be stored in the memory 452. If the memory 452 does not store a particular computer readable code for existing or new amplifiers, the microcontroller 450 may be able to obtain such computer readable code from the external sources 420, such as internet and other storage devices containing computer readable code. Accordingly, the digital signal processor 416 may perform signal processing to simulate unique distortions of various Fender tube amplifiers. Alternatively, or additionally, the dynamic memory 418 may store computer readable codes that are frequently or mainly used by the digital signal processor 416. The microcontroller 450 may also drive a display device 440. More detailed descriptions on structures of an audio signal processing system such as the system 100 may be found in U.S. Pat. No. 6,664,460, which is incorporated here by reference.

As shown in FIG. 4, the audio signal processing system 100 may be implemented by a data processing system such as a computer. Alternatively, or additionally, a digital signal processor residing in a different system may be used with the microcontroller 450 of the audio signal processing system 100 or a microcontroller residing in a different system may be used with the digital signal processor 416. For instance, System 1 may include a digital signal processor that executes computer readable code. Computer readable code may represent simulation effects that may include nonlinear effects and preamplifier effects. System 1 may output a processed audio signal. The processed audio signal may be stored in System 1 or onto storage medium such as a blank compact disc or other audio signal storage medium. A user of System 1 may desire to simulate sound engineering effects that she hears on Jimi Hendrix's sound recording. A user may desire to use System 2 to perform this simulation. System 2 may be a user's personal computer or a notebook computer. A user may load the processed audio signal from storage medium to System 2. Alternatively, a user may have System 1 transmit the processed audio signal to System 2 via network such as internet. The processed audio signal may operate as an input signal. A user also loads an audio signal from Jimi Hendrix's sound recording to System 2. System 2 may have its own digital signal processor and/or microcontroller such as the ones 416, 450 shown in FIG. 4. System 2 may execute computer readable code that simulate sound engineering effects of Jimi Hendrix's recording and apply it to the input audio signal processed and/or provided by System 1.

Figure 5:
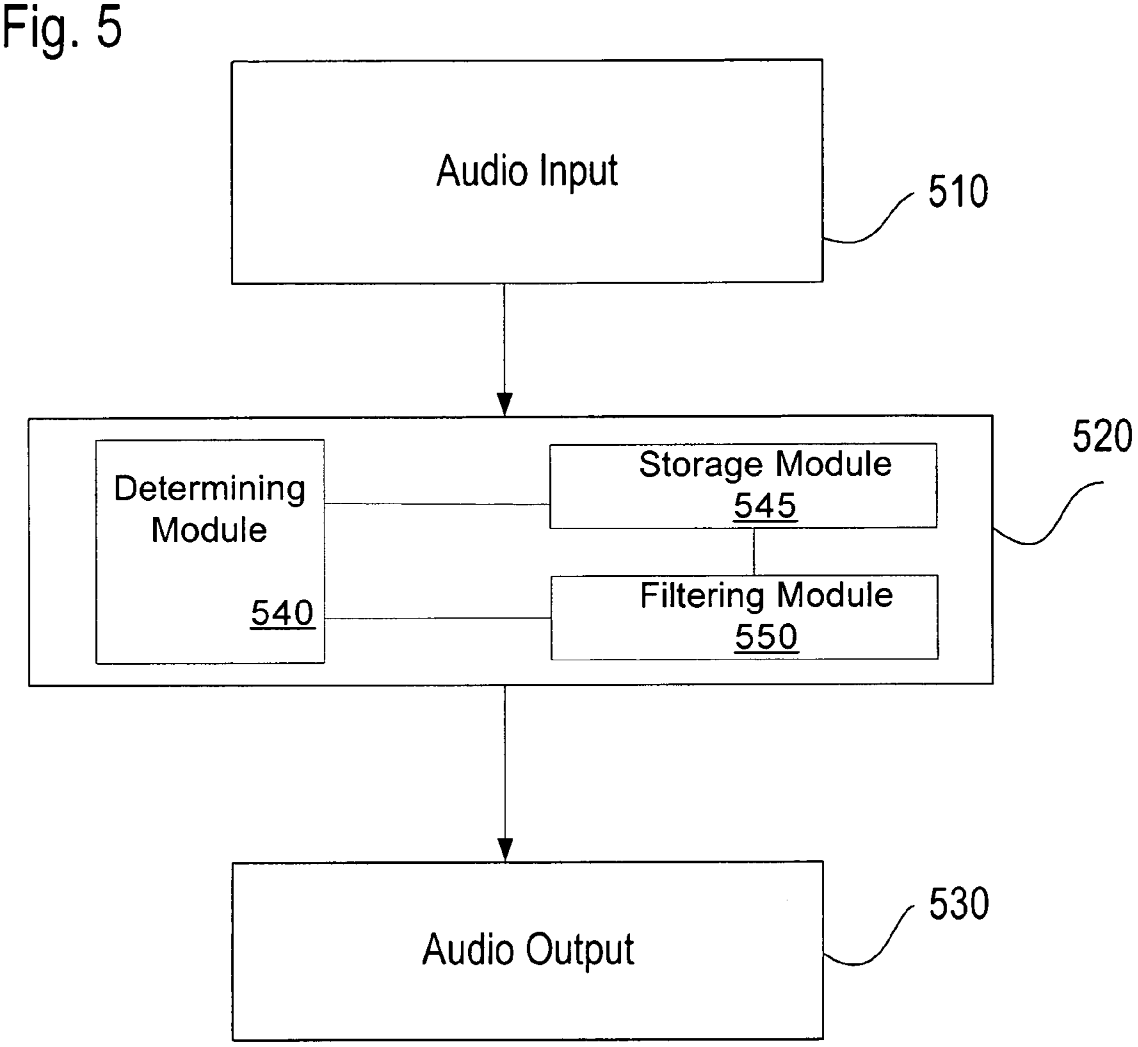
FIG. 5 is a block diagram of an example signal flow path involving an acoustic guitar.

FIG. 5 is a block diagram of an example signal flow path involving an audio signal from an acoustic guitar. The audio signal may be input from the acoustic guitar at block 510. As previously described, an acoustic guitar may not need to have an electrical amplifier. The audio signal from the acoustic guitar may be directly input to a simulation filter block 520. The input audio signal at the block 510 further includes a reference audio signal such as the sample audio signal 150. The reference audio signal may include sound engineering effects to be simulated. The simulation filter block 520 may be disposed in the digital signal processor 416 or the microcontroller 450 and/or memory 418, 452. The simulation filter block 520 may be configured to simulate sound engineering effects that may be applied to the audio signal at the block 510. The simulation filter block 520 may include a determining module 540, a storage module 545 and a filtering module 550. The determining module 540 provides resulting information to the storage module 545 and the filtering module 550. The determining module 540 receives the audio input including the original audio signal and the reference audio signal from the block 510. Based on the original audio signal and the reference audio signal, the determining module 540 may derive sound engineering effects that are to be simulated. As described above, the sound engineering effects may be present in the reference audio signal. The original audio signal may be provided from a sound source including an acoustic guitar in this example. By comparing the original audio signal and the reference audio signal, the sound engineering effects present in the reference audio signal may be determined at the determining module 540. The storage module 545 receives the determined sound engineering effects from the determining module 540 and stores it. A new audio signal generated with the same or a different musical instrument that has generated the reference audio signal may be an input to the simulation filter block 520. For example, the reference audio signal is generated with an electric guitar and comes from Jimi Hendrix's sound recording. A new audio signal generated with an electric guitar or an electric keyboard may be an input to the simulation filter block 520. The storage module 545 may store the determined sound engineering effects, so that the filtering module 550 may apply it to the new audio signal to produce a resulting audio signal, for example, an audio sound from an electric keyboard processed with the sound engineering effects of Jimi Hendrix's guitar.

The filtering module 550 may receive information from the determining module 540. The information may identify and represent the sound engineering effects. To represent the sound engineering effects, the information may indicate a frequency response such as low-pass filtering or high-pass filtering, or values of filter coefficients, etc. Based on the information, the filtering module 550 may condition the original audio signal to contain the sound engineering effects determined by the determining module 540. The filtering module 550 may be implemented by a single filter. Alternatively, or additionally, a plurality of filters cooperatively operating may be used if necessary. The simulation of sound engineering effects may be directly related to the design and configuration of the simulation filter. According to the desired sound engineering effects, the simulation filter at the block 520 has a determined frequency response. For instance, the sound engineering effects may have a low-pass filtering response that conditions only a low frequency portion of the audio signal being passed. The frequency response of the simulation filter may be translated into and represented by filter coefficient(s). To facilitate this translation, the simulation of sound engineering effects may be implemented with a linear and time invariant system. The linear and time invariant system may be readily implemented with a single filter. By processing the audio signal through the simulation filter, an output audio signal that is processed and conditioned to simulate the sound engineering effects is provided at block 530.

Figure 6:
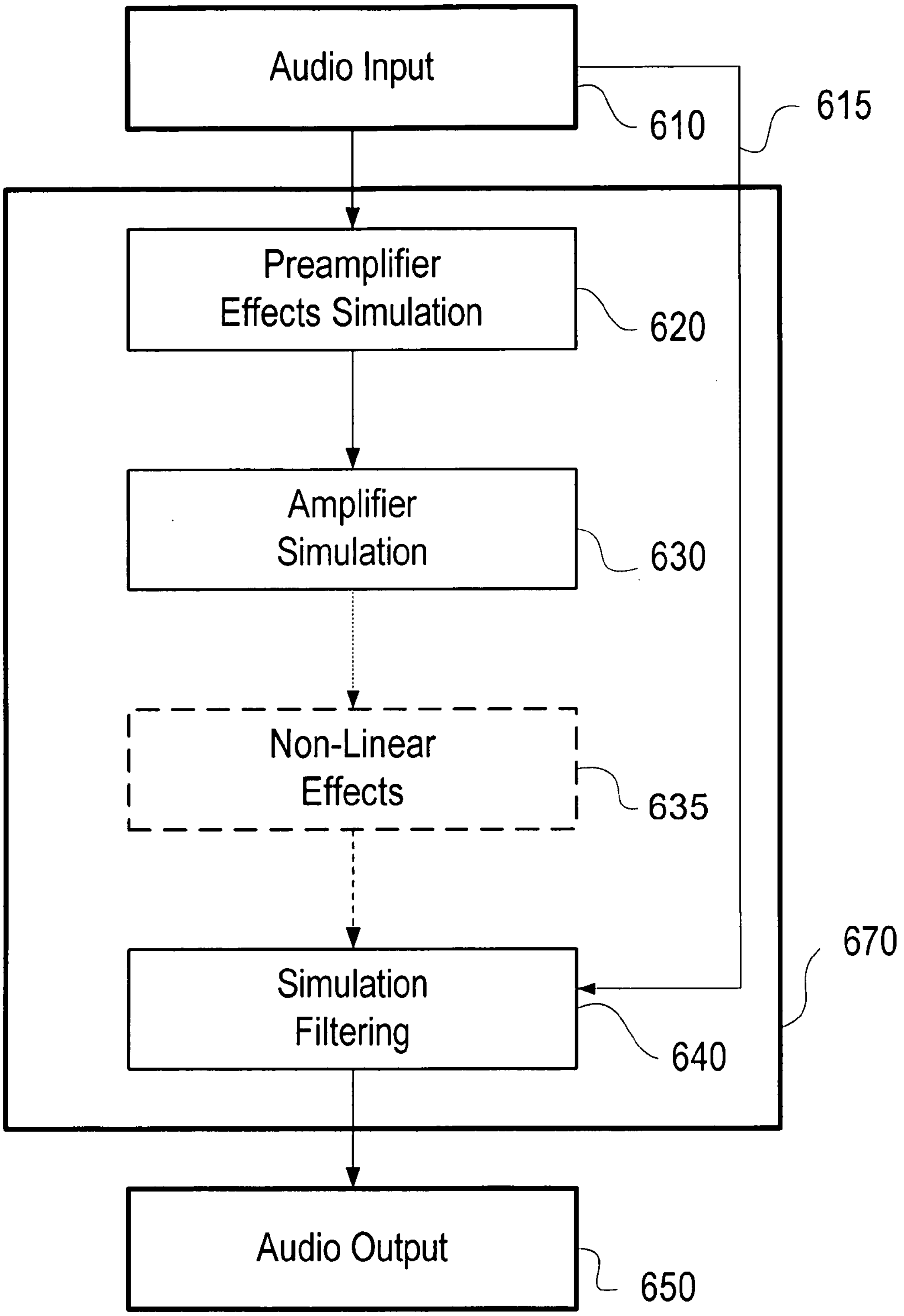
FIG. 6 is a block diagram of an example signal flow path involving an electric guitar.

FIG. 6 is a block diagram of an example signal flow path within the audio signal processing system 100 involving an audio signal from an electric guitar. The audio input is generated from the electric guitar and provided at block 610. A sample audio signal such as the sample audio signal 150 shown in FIG. 1 may be provided as another input (615) at the block 610. The audio signal and the sampling audio signal may be provided to block 670. The block 670 may include preamplifier effects simulation module 620, amplifier simulation module 630 and a simulation filtering module 640. Alternatively, or additionally, the block 670 may include an optional module 635 to process additional nonlinear effects simulation if necessary. The block 670 may be disposed in a digital signal processor or a microcontroller such as the digital signal processor 416 and the microcontroller 450 of FIG. 4. The audio signal at the block 610 may be provided to the preamplifier effects simulation module 620, whereas the sample audio signal 615 may bypass the preamplifier effects simulation module 620 and the amplifier simulation module 630. The sample audio signal 615 may be provided as an input to the simulation filtering module 640, as shown in FIG. 6.

The audio input at the block 610 may be subject to preamplifier effects at the module 620. The audio input at the block 610 may be converted to a digital format before it reaches the preamplifier effects module 620. The preamplifier effects 620 may include a series of one or more signal processing stages performed with the input audio signal. Signal processing stages may be 1 stage, 2 stages, 3 stages, 7 stages, etc. The preamplifier effects 620 may be a chain of filters. Each stage may include one or more signal processing circuits such as a filter, a phase shifter, a compressor, a volume control, etc. The filter(s) may include a high-pass filter, a band-pass filter, a low-pass filter, a comb filter, a notch filter, and/or an all-pass filter depending on the design and need for preamplifier effects. For example, a low-pass filter stage may attenuate power line noise or an input audio signal that is above a determined threshold frequency level. A band-pass filter stage may involve frequency enhancement, such as "Wah" effect processing. "Wah" effect processing may selectively increase the magnitude of one or more selected frequencies present in an audio signal. A high pass filter may be used to pass high frequencies and attenuate low frequencies. For example, a high pass filter may be used to pass notes/tones for a certain type of music, such as rock and roll music. A phase shifter may be an all-pass filter that shifts a center frequency and does not eliminate any portion of the input signal. Various designs and structures of preamplifier effects are possible.

After the preamplifier effects have been applied, the audio signal may be input to the amplifier simulation module 630. The amplifier simulation at the module 630 may simulate distortion effects of a tube amplifier. Distortion of the input audio signal may be produced by processing the audio signal in a nonlinear manner. For example, the input audio signal may be subject to clipping, compression, etc. Distortions may include harmonic distortion and intermodulation distortion. Generally, harmonic distortion may be musically pleasing audible sound, whereas the intermodulation distortion may result in undesirable audible sound. Accordingly, the intermodulation distortion may need to be minimized as much as possible. An amplifier using vacuum tube technology is known to generate high quality harmonic distortions. The amplifier simulator may simulate harmonic distortions that a certain tube amplifier typically generates. As described above, most of distortions may be achieved by nonlinear functions such as clipping, compression, etc. Accordingly, the audio signal may be clipped or compressed at the amplifier simulation module 630. Alternatively, or additionally, various nonlinear functions may be possible at the amplifier simulation module 630.

The audio input that is output from the amplifier simulation module 630 may contain all the desired nonlinear effects. Alternatively, distortion and/or other nonlinear effects may be added after the module 630 and prior to simulation filtering at module 640 in an optional nonlinear effects module 635. For example, if simulation of a sound engineering effect requires additional nonlinear effects, the nonlinear module 635 may be added between module 630 and module 640. The nonlinear module 635 is illustrated as dotted in FIG. 6 to illustrate the optional nature of this block.

In FIG. 6, the simulation filtering module 640 may follow the amplifier simulation module 630 or alternatively, the nonlinear effects module 635. The simulation filtering module 640 may simulate the sound engineering effects by using a simulation filter. The simulation filter may be implemented by a single filter. To use a single filter to simulate the sound engineering effects of a sample audio signal, the sound engineering effects may be represented as a linear system. If the sound engineering effects may include nonlinear components, it may not use a single filter for the simulation. Almost all sound engineering effects may be simulated or modeled with a linear system. A producer or a sound engineer may have included a certain nonlinear effect, such as compression or reverb as a part of the sound engineering effects of a sample audio signal. Such nonlinear effects may not be universally used as a sound engineering effect. Further, absence of these effects may not undermine the quality of the simulated sound engineering effects. As a result, the simulation filter at the module 640 that is implemented by a single linear filter may sufficiently and adequately simulate the sound engineering effects present in the sample audio signal 615, such as a recorded guitar sound.

Nonlinear effects such as those provided in the modules 630 and 635 may be executed separately from the execution of simulation filtering of the module 640 to promote computation efficiency and straightforward implementation of the simulation filtering module 640. The combination of the simulation filtering of the module 640 with nonlinear effects (such as those present in the modules 630 or 635) may complicate the computations performed by processors such as the digital signal processor 416 and/or the microcontroller 450. Further, consolidation of nonlinear effects such as those present in the module 630 or 635 with the simulation filtering of the module 640 may not be possible since the simulation filtering may employ a linear time invariant system.

Although not shown in FIG. 6, the simulation filtering module 640 may have the same structure as the block 520 of FIG. 5. The simulation filtering module 640 may include a determining part, a storage part and a filtering part. The determining part may determine the sound engineering effects based on the sample audio signal 615 and the audio signal at the block 610 and provides information relating to the determined sound engineering effects to the filtering part. The filtering part may condition the audio signal based on the information provided by the determining part. As a result, the audio output at the block 650 may include the same sound engineering effects present in the sample audio signal 615. The storage part may store the determined sound engineering effect so that the filtering part may apply it to another input audio signal from the same or different musical instrument.

Figure 7:
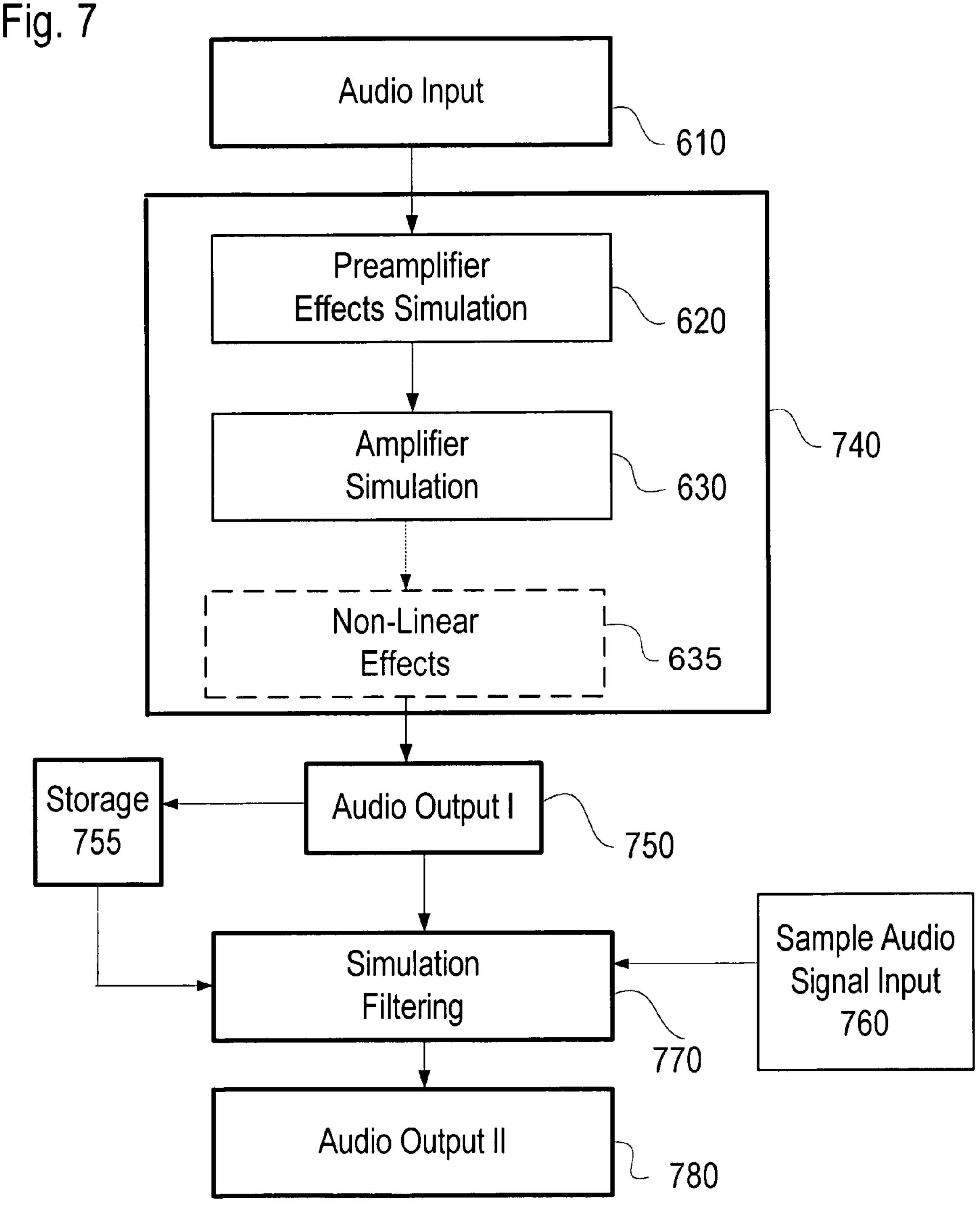
FIG. 7 is a block diagram of another example signal flow path involving an electric guitar.

FIG. 7 is a block diagram of another example signal flow path within the audio signal processing system 100 involving an audio signal from an electric guitar. Blocks 610 and modules 620-635 are described in FIG. 6. Block 740 may be, however, different from the block 670 because the simulation filtering module 640 does not reside. In FIG. 7, the block 740 may output an audio signal at block 750 after processing preamplifier effects simulation, amplifier simulation and/or optional nonlinear effects 635. The output audio signal may be stored in storage 755. The storage 755 may be a computer hard drive, a compact disc, a digital versatile disc or any type of storage medium suitable for an audio signal. A sample audio signal at block 760 may be input to a simulation filtering block 770. The audio output at the block 750 stored in the storage 755 may be another input to the simulation filtering block 770. As described above, the simulation and filtering may be performed at the simulation filtering block 770. A resulting audio signal may be output at block 770. At the blocks 750 and 780, two different audio signals may be output as audio output I and audio output II. The audio output I at the block 750 may be input to the simulation filtering block 770 and the audio output II at the block 780 may be output from the simulation filtering block 780.

FIG. 6 and FIG. 7 show two different examples of the audio signal processing system 100 involving an audio signal from an electric guitar. Specifically, FIG. 6 shows real-time audio signal processing, as opposed to off-line audio signal processing shown in FIG. 7. The audio output I at block 750 may be stored in the storage 755. Simulation filtering may occur subsequent to the audio output I as real-time or it may be performed later as off-line processing. The off-line processing may be performed by the same or different data processing system such as Systems I and II as noted above.

Referring to FIGS. 5-7, simulating sound engineering effects applied to an audio signal from an acoustic guitar and an electric guitar may be different. The acoustic guitar may not require any nonlinear effects and the block 520 may simulate the sound engineering effects. To the contrary, the electric guitar may need to have an electric amplifier and/or preamplifier effects prior to simulation of the sound engineering effects. Simulation of the amplifier may involve nonlinear signal processing, which may be separately processed from the simulation filter of module 640. Despite these differences, it is apparent that a simulation filter may be able to simulate the sound engineering effects. The simulation filter may be implemented with one filter. The simulation filter may be a digital filter and simulate a linear, time invariant system. In other words, the sound engineering effects may be represented as a linear system and may be implemented by one linear filter. The simulation filter may be executed by processors such as the digital signal processor 416 and/or the microcontroller 450. The digital signal processor 416 and the microcontroller 450 may execute a computer readable code that implements the simulation filter.

Figure 8:
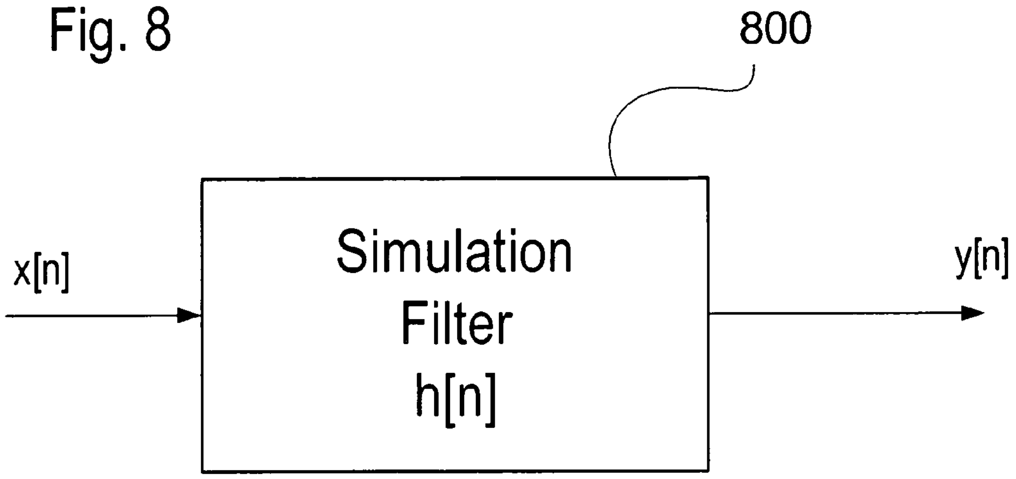
FIG. 8 is a block diagram illustrating implementation of an example simulation filter.

Referring to FIGS. 8-11, the simulation filter will be discussed in detail. FIG. 8 is a block diagram illustrating an example simulation filter 800 that may operate similar to the simulation filtering discussed with reference to FIGS. 5-7. The simulation filter 800 may process an input signal x[n] to provide an output signal y[n]. The simulation filter 800 may be a linear filter that constitutes a linear time invariant system. Processing by the filter 800 may provide the output signal y[n] that is proportional to the input signal x[n]. The filter 800 may be represented by a filter response h[n]. The relationships among x[n], h[n] and y[n] may be expressed with the following equation:

$$y[n]=x[n]*h[n] \quad \text{(Equation 1)}$$

The simulation filter 800 may be realized by using a finite impulse response ("FIR") filter. Alternatively, or additionally, other types of filters are possible. For example, instead of a FIR filter, an infinite impulse response ("IIR") filter or a hybrid of a FIR filter and an IIR filter may be used. The FIR filter may be a digital filter. The FIR filter may be easy and simple to implement in software, and a single instruction may implement the FIR filter. Further, when the FIR filter is used, some of calculations may be omitted, thereby increasing computational efficiency. The FIR filter may be suitable as the simulation filter 800 because it may be designed to be a linear filter. The filter response h[n] is an impulse response of the FIR filter and the impulse response h[n] may be, in turn, the set of filter coefficients. The impulse may consist of a "1" sample followed by many "0" samples. If the impulse is an input to the FIR filter, the output of the FIR filter will be the set of the coefficients since the sample "1" moves past each coefficient sequentially. Where a signal is input to the FIR filter, the output of the filter will be based on the set of the filter coefficients provided by filter coefficient h[n]. Another characteristic of the FIR filter is a length of the filter. This may be called the number of "tap," which is a coefficient/delay pair. If the FIR has the length of 3, there are three pairs of the filter coefficient (h0, h1, h2)/delay (d0, d1, d2). The number of tap or the length of the FIR filter may indicate the amount of memory that is necessary to implement the filter and the amount of calculation required, etc. Determination of the length as described later and the filter coefficient(s) of the FIR filter may be part of designing the FIR filter.

Figure 9:
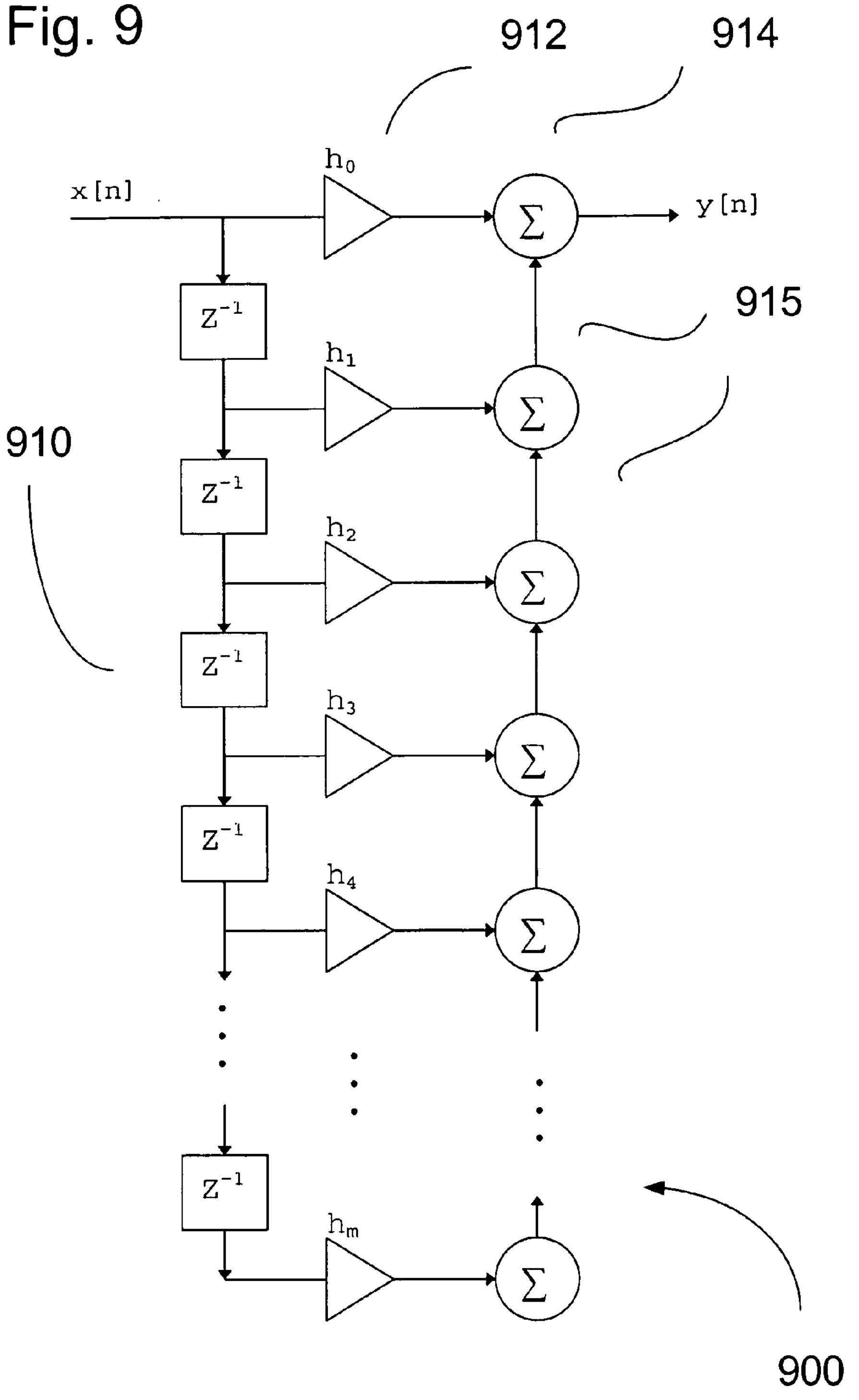
FIG. 9 is a block diagram illustrating a detailed structure of the simulation filter illustrated in FIG. 7.

FIG. 9 is a block diagram illustrating an example detailed structure of the simulation filter 800 that is realized with an FIR filter 900. The FIR filter 900 has input signal x[n], output signal y[n] and filter coefficients $h_0$ to $h_m$. The FIR filter 900 includes a plurality of delay blocks 910 and a plurality of filter coefficient blocks 912 each including a respective delay ($Z^{-1}$) and a filter coefficient ($h_m$). A first delay block 912 is includes a delay of $Z^{-1}$ that indicate a period of delay that is substantially equal to the sampling frequency. The FIR filter 900 may operates to multiply an array of the most recently sampled signal, such as x[n], x[n−1/fs], x[n−2/fs]. . . x[n−m/fs], by an array of the filter coefficients $h_0$ to $h_m$. A plurality of summers 914 may be used to sum the results of multiplication. The filter coefficients $h_0$ to $h_m$ provide the impulse response of the FIR filter. The impulse response h[n] is:

$$h[n]=0(k<0 \text{ and } k>m)\ h_k,\ (0\leq k\leq m) \quad \text{(Equation 2)}$$

The FIR filter 900 may be designed to have the desired frequency response by changing the length of the FIR filter 900. The length of the FIR filter 900 is M, where M equals the number of filter coefficients m+1. Sound engineering effects applied to a sample audio signal may have a specific frequency response. The frequency response may be translated in and represented by the length M and the impulse response of the FIR filter 900 provided by the filter coefficients $h_0$ to $h_m$. For example, if the frequency response of the sound engineering effects may take the form of low-pass filtering, the coefficients and the length of the FIR filter 900 may be determined to have values that correspond to the low-pass filtering and an audio signal will be conditioned to have low frequency range passed and high frequency range filtered by the FIR filter 900.

The FIR filter 900 may be designed to be minimum phase as shown in FIG. 9 (specifically, arrows 915). Most of FIR filters used in the digital audio signal processing field may be a linear-phase filter. The term, "linear-phase" indicates that a filter has the phase response that is a linear function of frequency such as a sampling frequency. As a result, linear-phase filters experience phase delay, which may adversely affect an audio signal processing system, in particular, a system that processes a live audio signal. For example, if a linear filter causes about 0.5 second delay in processing an audio signal therethrough, such filter cannot be used with a live audio signal because the resulting sound is unnatural. For that reason, a minimum-phase filter may be used, because it has less delay than a linear-phase filter and is able to provide the same amplitude response as that of a linear-phase filter. Mathematically, a minimum-phase filter has a frequency response whose poles and zeroes are inside the unit circle. The largest magnitude signal of a minimum-phase filter is found near time zero and the magnitude of signal decays over time. If the FIR filter 900 may be a minimum-phase filter, the largest magnitude coefficient may be found in the minimum-phase. If the FIR filter 900 may be a low-pass filter, the largest magnitude coefficient is near the beginning of the impulse response. On the other hand, if the FIR filter 900 may be a linear-phase filter, the largest magnitude coefficient is found in the center of the impulse response. Consequently, the minimum-phase FIR filter 900 may minimize adverse effect that results from any delay. This makes audio signal processing more efficient and improves resulting audio signal sound quality. Further, common analog filters are mostly minimum-phase filters. Thus, if the FIR filter 900 is designed to be minimum-phase, it may be more analogous to an analog system.

Figure 10:
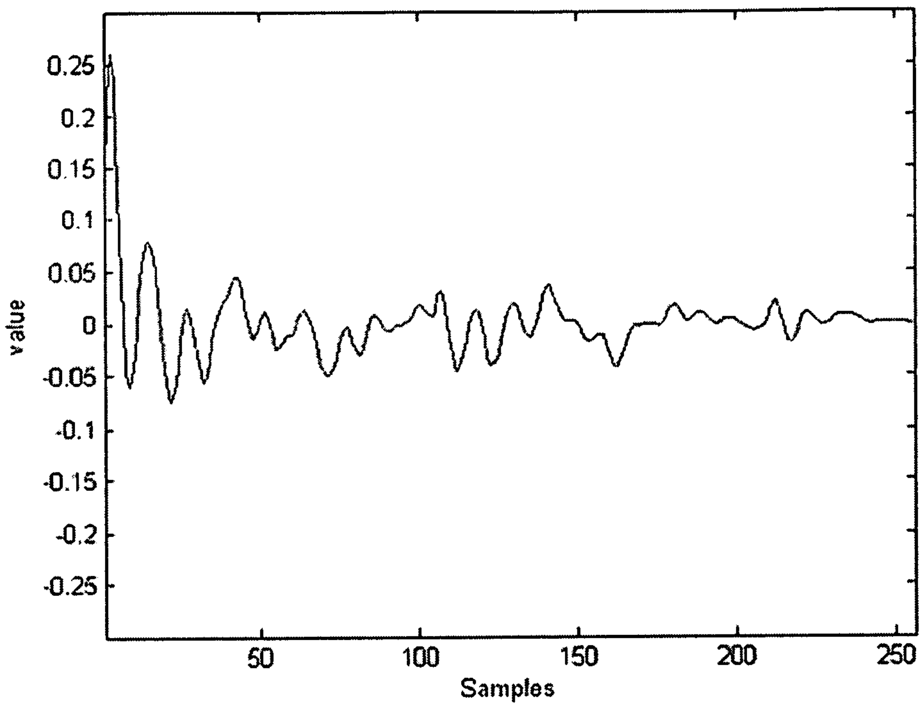
FIG. 10 illustrates an example impulse response of a finite impulse response ("FIR") filter in time domain.
Figure 11:
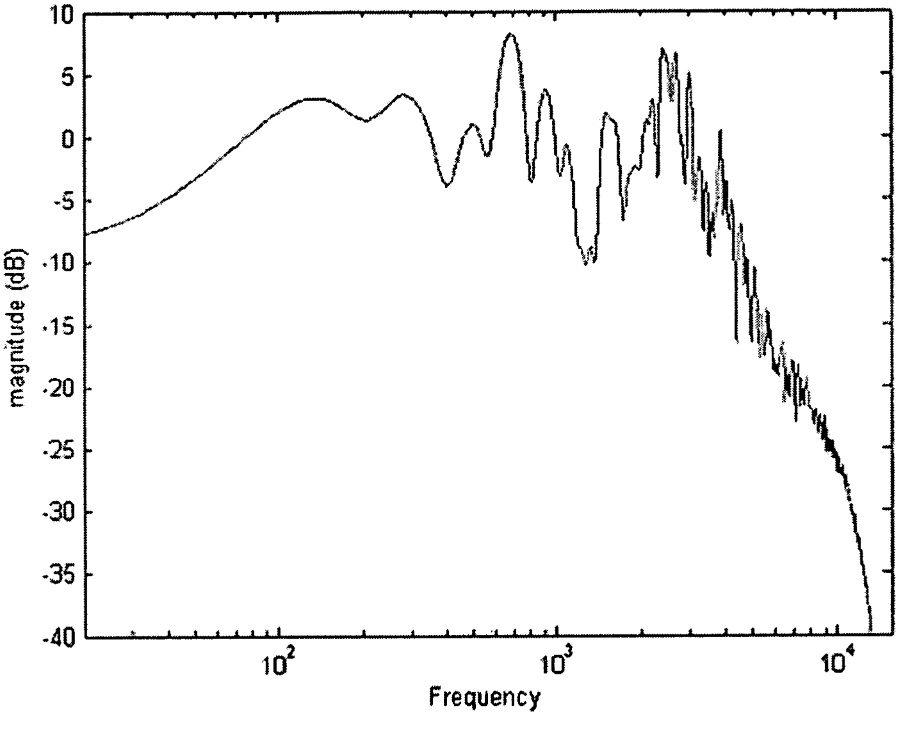
FIG. 11 illustrates an example impulse response of the FIR filter in frequency domain.

FIGS. 10 and 11 illustrate examples of impulse responses of the FIR filter 900 of FIG. 9. FIG. 10 illustrates the impulse response of the FIR filter 900 in time domain. FIG. 11 illustrates the impulse response of the FIR filter 900 in frequency domain. As shown in FIG. 11, the FIR filter 900 may generally have the frequency response of a low-pass filter. However, the length and the impulse response of the FIR filter 900 may be varied to achieve the simulated sound engineering effects of a particular sample audio signal. By way of example, FIG. 10 shows that the length M of the FIR filter 900 may be 256 based on the FIR filter including 256 filter coefficients $h_0$ to $h_{255}$. The larger the length M is, the finer the tuning of the frequency response may be made with the FIR filter 900. Alternatively, or additionally, the length of the FIR filter may be much longer than 256, for example, 768. Specific lengths of the FIR filter 900 above are example only and do not limit a range of the FIR filter 900. The value of the filter coefficients representing the impulse response of the FIR filter 900 also varies in a broad range. Only for example, the range of the filter coefficients may be between +1.0 and −1.0.

As described above, the FIR filter 900 may be a minimum-phase filter. Referring to FIG. 10, the largest magnitude coefficient may be found in the beginning of the low-pass impulse response. Thus, it does not experience any adverse effect on the resulting signal due to long length of the filter. The FIR filter 900 may be used with a live audio signal and a recorded audio signal without any delay problem. For example, the FIR filter 900 having the 768 taps may be able to simulate sound engineering effects of an acoustic guitar properly and naturally.

Figure 12:
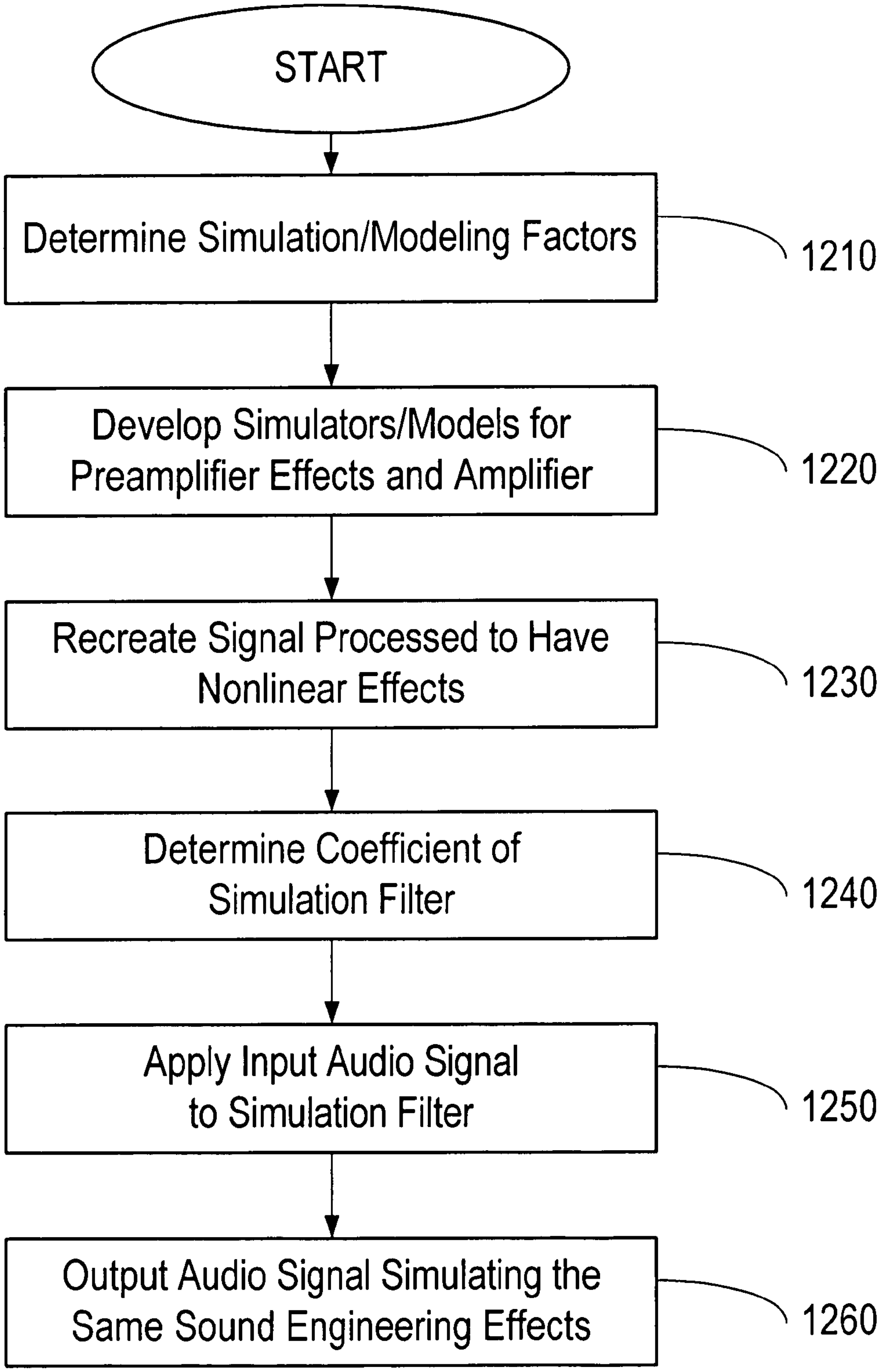
FIG. 12 is a flowchart illustrating an example method for simulating sound engineering effects.

FIG. 12 is a flowchart illustrating an example method for simulating sound engineering effects. Musicians and engineers may simulate a certain recorded sample audio signal. A medium storing the recorded sample audio signal may used by musicians and engineers. In particular, musicians may desire to simulate an electric guitar sound or an acoustic guitar sound. For example, a guitar sound from an Eric Clapton recording or Jimi Hendrix's recording may be simulated. Alternatively, or additionally, a musician may desire to simulate his or her own sound recording that has been previously completed. For example, a musician may plan to do a national tour and desires to simulate his or her recorded version of music, so that he or she can produce a studio version sound at a live performance. A studio version sound may be more sophisticated, trimmed and musically appealing than a live performance sound.

At block 1210, factors required for simulation/modeling of preamplifier effects and an amplifier based on a sample audio signal may be determined. Specifically, information on the guitar, the amplifier, the preamplifier effects, etc. that were used to create the sample audio signal may be determined. Tonal characteristics of a certain guitar and/or amplifier may be readily recognizable by professional musicians, producers and/or sound engineers. Such information may be made public by artists, producers, etc. Alternatively, software, computer readable code and/or suitable hardware may be used to collect the information and/or improve the accuracy of the collected information. If a musician tries to simulate his or her own recording, such information may already be available.

Having collected information on the guitar, the preamplifier effects, and the amplifier used to make the sample audio signal, an amplifier simulator and/or preamplifier effects block may be modeled at block 1220. Developing an amplifier simulator may include simulating unique tonal characteristics, such as distortion of an amplifier. Once information on an amplifier and a guitar is available, modeling an amplifier simulator may be readily made. As mentioned above, a simulation filter may be a linear filter and nonlinear effects may be separated from the simulation filter. For that purpose, audio signal may be recreated before it is input to the simulation filter. At block 1230, audio signal, which is processed to have nonlinear effects present in the sample audio signal may be recreated. The simulated preamplifier effects and the simulated amplifier effects may be applied to an audio signal to recreate a preamplified and amplified version of the sampled audio signal. The preamplified and amplified version of the audio signal may be used as an input signal to the simulation filter. Alternatively, or additionally, the audio signal may be stored in a storage medium suitable for an audio signal such as a hard drive, a compact disc to be used later. As described in connection with FIG. 7, the blocks 1230 and 1240 may be processed in real-time or off-line. If the sample audio signal is an acoustic guitar sound, blocks 1220 and 1230 may not be needed. Accordingly, at this stage, the input signal to the simulation filter and the output signal from the simulation filter are known. The output signal from the simulation filter is the sample audio signal as shown in FIG. 12. Because the input and output signals are available, filter coefficients of the simulation filter may be determined, as will be described in FIG. 12.

At block 1240, determination of the filter coefficients representing h[n] is performed. The determination of the filter coefficients may be made by executing computer readable code that implements mathematical computation. If the input signal and the desired output signal are known, any output may be obtained by convolving the input and the filter coefficients. Such output signal is conditioned to simulate the sound engineering effects of the sample audio signal. The filter coefficients may be determined based on the input and the output audio signals by using Fast Fourier Transform ("FFT") techniques. As described above at block 1230, the input, such as an audio signal from an electric guitar that was created using preamplifier effects and amplifier effects is recreated to contain the nonlinear distortions present in the sample audio signal. Alternatively, or additionally, the input to the simulation filter may be an audio signal of an acoustic guitar that is sensed by a microphone. The output is the sample audio signal, such as a previously recorded sound. To determine h[n], a Fast Fourier Transform of the input and output signals x[n] and y[n] may be performed as follows:

$$X(k) = \sum_{n=1}^{N} x(n)e^{\frac{(-j2\pi(k-1)(n-1))}{N}} \quad \text{(Equation 3)}$$

where $1 \le k \le N$ $$Y(k) = \sum_{n=1}^{N} y(n)e^{\frac{(-j2\pi(k-1)(n-1))}{N}} \quad \text{(Equation 4)}$$

where $1 \le k \le N$

The Fourier Transform is a valuable tool in designing filters because most filters are configured to filter out some frequency component of a signal. The Fourier Transform takes signals from the time domain into the frequency domain to view their characteristics as a result of filtering. In particular, Fast Fourier Transform is very effective tool in designing filters having numerous filter coefficients because an input signal is transformed to a more desirable form before computation. Accordingly, computational efficiency may be substantially improved using Fast Fourier Transform. The following is derived from the equation (1):

$$h[n]=y[n]/x[n] \quad \text{(Equation 5)}$$

Equation (5) is also applicable in frequency domain. Accordingly, to get H(k), it is necessary to divide Y(k) by X(k).

$$H(k)=|Y(k)|/|X(k)| \quad \text{(Equation 6)}$$

As is apparent from Equation 6, H(k) may concentrate on magnitude information and may not particularly consider phase information. As a practical standpoint, phase information may not convey much significance because timing difference almost always happens in generation of sound. For example, the same performance by the same artist of the same sound at two different occasions may not guarantee the exact same timing of that sound. It frequently happens that there may be off-timing when the artist strikes a certain note at the first performance and the next one. This off-timing may be related to phase difference and the phase difference may not affect simulation of the sound as well as the sound engineering effects. Further, because the simulation filter is designed to be a linear filter and covers a linear, time invariant system, there may be no phase distortions. Accordingly, magnitude information without phase information may be sufficient to achieve desired simulation of the sound engineering effects.

Next, the impulse response h(n) corresponding to a set of filter coefficients requires an inverse Fast Fourier Transform of H(k).

$$h(n) = (1/N)\sum_{k=1}^{N} H(k)e^{\frac{(j2\pi(k-1)(n-1))}{N}} \quad \text{(Equation 7)}$$

where $1 \le n \le N$

If h[n] is determined, the output signal y[n] may be determined for any input signal x[n]. Regardless of an input signal x[n], it is possible to reproduce a recorded version of a sampled audio signal that includes simulated sound engineering effects using a known impulse response h(n). Alternatively, or additionally, if the same input signal is input to the simulation filter, the sample audio signal y[n] may be reproduced by convolving x[n] and h[n]. When impulse response h[n] has been determined at block 1240 as previously described, a new audio input signal may be applied to the simulation filter at block 1250. The audio input signal may be supplied using a different type of guitar, amplifier and/or preamplifier effects. Simulated sound engineering effects that are similar to the sound engineering effects applied to the sample audio signal may be added to the audio input signal by having the audio input signal be processed with the simulation filter. At block 1260, an audio signal that includes simulated sound engineering effects that are similar to the sample audio signal may be output from the audio output.

The system for simulating sound engineering effects may allow musicians to simulate the sound that they hear on a sound recording. Musicians may need or desire to simulate a particular sound on a sound recording, such as a guitar sound on a sound recording of Eric Clapton, for training or use with their own music. In addition, musicians may desire to play a previously studio recorded version of music during a subsequent live performance. For instance, musicians have completed the recording of their music and plan to go on a tour. During live performance on the tour, musicians may entertain the audience by providing the studio recorded version of music. This may be facilitated by the mobility or portability of the system for simulating the sound engineering effects. Because the system can be designed and configured to be portable, musicians may easily bring the system with them on a tour. Further, the system may be compatible with any type of data processing system such as a personal computer.

The system for simulating the sound engineering effects may use a single filter to simulate the sound engineering effects. The single filter may be realized in a finite impulse response filter. Designing and realizing the filter may be simple and computation efficiency may be achieved. Furthermore, the system for simulating the sound engineering effects may be used for both electric and acoustic musical instruments.

Although the system for simulating sound engineering effects has been described in connection with a guitar, the invention is not limited to a guitar and/or other musical instruments. To the contrary, the invention may be applicable to other simulation systems or methods that involve any type of sound.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A system for simulating sound engineering effects, the system comprising:

including sound engineering effects and derived from a previously produced sound recording of audible sound, the sound recording generated by selecting a first musical instrument and selectively positioning the first musical instrument in a space where the sound recording is generated;

an input audio signal devoid of the sound engineering effects and derived from an audible sound generated by a second musical instrument; and a filter configured to condition the input audio signal to simulate the sound engineering effects present in the input sample audio signal, the filter being further configured to alter the audible sound to output a resultant audio signal which includes the sound engineering effects.

2. The system of claim 1, where the filter is configured to apply to the input audio signal a frequency response that simulates the sound engineering effects.

3. The system of claim 1, where the input audio signal and the input sample audio signal are generated with a musical instrument.

4. The system of claim 3, where the first musical instrument that generates the input sample audio signal and the second musical instrument that generates the input audio signal are substantially similar.

5. The system of claim 3, where the first musical instrument that generates the input sample audio signal and the second musical instrument that generates the input audio signal are different.

6. The system of claim 1, where a frequency response of the filter is determined based on the input audio signal and the input sample audio signal.

7. The system of claim 1, where the filter is a linear filter and is a minimum-phase filter.

8. The system of claim 1, where the filter is a digital filter and is a minimum-phase filter.

9. The system of claim 2, where the frequency response of the filter is a low-pass filtering response.

10. The system of claim 1, where the filter is a finite impulse response ("FIR") filter.

11. The system of claim 10, where the FIR filter includes 256 filter coefficients.

12. The system of claim 10, where the FIR filter includes 768 efficients.

13. The system of claim 10, where a frequency response of the sound engineering effects are translated into and represented by an impulse response of the FIR filter.

14. The system of claim 1, where each of the first musical instrument and the second musical instrument is an electric guitar.

15. The system of claim 1, where at least one of the first musical instrument and the second musical instrument is an acoustic guitar.

16. The system of claim 1, where the filter is only one filter that is configured as a linear time invariant system.

17. A system for simulating signal engineering effects, the system comprising:

a first system configured to simulate distortion effects of an amplifier, where the distortion effects include at least one nonlinear effect; and a second system configured to receive an audio signal processed by the first system to have the distortion effects and filter the audio signal to simulate sound engineering effects, where the second system is linear and time invariant, where the audio signal is devoid of the sound engineering effects and generated by a first musical instrument;

where the sound engineering effects are determined based on an input sample audio signal derived from a previously processed and recorded audible sound, and the input sample audio signal is processed by the first system by selecting a second musical instrument and selectively positioning the second musical instrument in a space where the sound is generated.

18. The system of claim 17, where the second system includes only one filter.

19. The system of claim 18, where the filter is configured with a determined frequency response that corresponds to the sound engineering effects and further includes a low-pass filter response.

20. The system of claim 17, where the audio signal is suppliable with an electric guitar.

21. An audio signal processing system, comprising:

an input terminal configured to receive an audio signal and input sample audio signal, where the audio signal is configured to be generated from a first musical instrument and where the input sample audio signal is configured to include sound engineering effects and is derived from a previously produced sound recording of audible sound, the sound recording generated by selecting a second musical instrument and selectively positioning the second musical instrument in a space where the sound recording is generated; and a signal processor configured to execute computer readable code that implements a linear filter, where the linear filter conditions the audio signal to simulate the sound engineering effects included in the input sample audio signal, where the sound engineering effects to be simulated are determined based on the audio signal and the input sample audio signal.

22. The audio signal processing system of claim 21, where the signal processor is further configured to execute the computer readable code to implement nonlinear processing of the audio signal.

23. The audio signal processing system of claim 22, where the nonlinear processing of the audio signal includes clipping of the audio signal.

24. The audio signal processing system of claim 22, where the nonlinear processing includes compression of the audio signal.

25. The audio signal processing system of claim 21, where the signal processor is further configured to execute the computer readable code to simulate a plurality of preamplifier effects.

26. The audio signal processing system of claim 25, where simulation of the preamplifier effects includes filtering of the audio signal at a determined frequency.

27. The audio signal processing system of claim 21, where the linear filter is configured to have a determined frequency response corresponding to the sound engineering effects.

28. The audio signal processing system of claim 27, where the frequency response includes a low-pass filtering process.

29. The audio signal processing system of claim 21, where the linear filter includes a minimum-phase finite impulse response ("FIR") filter.

30. The audio signal processing system of claim 21, where the linear filter includes a finite impulse response ("FIR") filter and the FIR filter has a length of 256.

31. The audio signal processing system of claim 21, where the linear filter includes a finite impulse response ("FIR") filter and the FIR filter has a length of 768.

32. A system for simulating sound engineering effects, comprising:

input receiving means configured to receive an audio signal and an input sample audio signal, where the input sample audio signal includes sound engineering effects is derived from a previously produced sound recording of audible sound, the sound recording generated by selecting a musical instrument and selectively positioning the musical instrument in a space where the sound recording is generated;

a processor configured to receive the audio signal and the input sample audio signal and process the audio signal based on a frequency response, where the frequency response corresponds to the sound engineering effects and is determined based on the input sample audio signal and the audio signal;

a memory in communication with the processor, the memory configured to store computer readable code that is executable to determine the frequency response; and output means configured to output a processed audio signal that includes simulated sound engineering effects based on the frequency response.

33. The system of claim 32, where the processor includes a digital signal processor and a microprocessor, and the microprocessor is configured to direct the digital signal processor to execute first computer readable code stored in the memory to implement nonlinear effects and then execute second computer readable code stored in the memory to implement a linear filter.

34. The system of claim 33, where the microprocessor is configured to direct the digital signal processor to process the audio signal in accordance with the computer readable code retrievable by the microprocessor from the memory.

35. The system of claim 33, where the microprocessor is configured to obtain computer readable code that is not stored in the memory from an external source.

36. An audio signal processing system, comprising:

an input signal that includes an audio signal and an input sample audio signal, where the audio signal is a signal generated with a musical instrument and the input sample audio signal is a previously processed signal that includes sound engineering effects and represents a sound recording of audible sound generated by selecting at least one of a musical instrument, an amplifier, a loudspeaker, or a microphone and selectively positioning at least one of the musical instrument, the amplifier, the loudspeaker, or the microphone in a space where the sound recording is generated;

a first filter system that includes a filter configured to condition an audio signal;

a nonlinear effect simulator configured to receive the audio signal processed by the first filter system and modify the audio signal nonlinearly; and a second filter system configured to receive the modified audio signal from the nonlinear effect simulator and process the modified audio signal to have a frequency response that corresponds to the sound engineering effects, where the sound engineering effects are present in the input sample audio signal and are determined based on the sample audio signal and the modified audio signal.

37. The system of claim 36, where the nonlinear effect simulator is configured to modify the audio signal processed by the first filter system to include harmonic distortion.

38. The system of claim 36, where the filter includes at least one of a low-pass filter, a high-pass filter, a band-pass filter, an all-pass filter, a notch filter and a comb filter or a combination thereof.

39. The system of claim 36, where the first filter system is configured to simulate preamplifier effects.

40. The system of claim 39, where the nonlinear effect simulator is configured to simulate the acoustical effect created by an analog amplifier.

41. The system of claim 40, where the nonlinear effect simulator is further configured to simulate the acoustical effect of a cabinet speaker.

42. The system of claim 40, where the second filter system is configured to simulate the sound engineering effects with one filter.

43. The system of claim 40, where the second filter system is configured to simulate the sound engineering effects with a finite impulse response ("FIR") filter.

44. The system of claim 43, where the FIR filter is minimum-phase and includes 256 filter coefficients.

45. The system of claim 43, where the FIR filter conditions the modified audio signal with a low-pass filtering frequency response.

46. A method for simulating sound engineering effects, comprising:

determining at least one simulation factor based on an input sample audio signal derived from a previously produced sound recording of audible sound, where the simulation factor includes a type of a musical instrument, an amplifier and a preamplifier effect, and selective positioning of the musical instrument, the amplifier and an instrument generating the preamplifier effect and a selected acoustic effect to generate sound engineering effects;

developing a first simulation system that simulates the preamplifier effect and the amplifier;

generating with the first simulation system a simulated audio signal from an audio signal received from a musical instrument where the simulated audio signal is devoid of the sound engineering effects;

developing a second simulation system that simulates sound engineering effects present in the sample audio signal based on the simulated audio signal and the input sample audio signal; and altering the simulated audio signal and outputting a resultant audio signal including the sound engineering effects.

47. The method of claim 46, where the step of developing the second simulation system comprises identifying a frequency response that corresponds to the sound engineering effects based on the simulated audio signal and the input sample audio signal.

48. The method of claim 47, where the step of identifying the frequency response includes executing computer readable code that implements a linear filter.

49. The method of claim 47, where the step of identifying the frequency response includes determining a length and at least one coefficient of a linear filter.

50. The method of claim 47, where the step of identifying the frequency response includes deriving the frequency response from a relationship of the simulated audio signal and the input sample audio signal.

51. The method of claim 50, where the step of deriving the frequency response includes:

transforming the simulated audio signal into the frequency domain;

transforming the input sample audio signal into the frequency domain;

dividing the input sample audio signal by, the simulated audio signal to provide a result; and transforming the result into the time domain.

52. The method of claim 46, where the step of generating the simulated audio signal and the step of developing the second simulation system are performed as real-time processing.

53. The method of claim 46, where the step of generating the simulated audio signal and the step of developing the second simulation system are performed as off-line processing.

54. The method of claim 46, further comprising storing the sound engineering effects simulated by the second simulating system.

55. The method of claim 54, further comprising receiving another audio signal generated with the musical instrument.

56. The method of claim 55, where the musical instrument generating the audio signal is different from the musical instrument generating another audio signal.

57. The method of claim 55, further comprising applying the stored sound engineering to another audio signal.

* * * * *